(12) United States Patent
Leu et al.

(10) Patent No.: US 6,866,368 B2
(45) Date of Patent: Mar. 15, 2005

(54) FLEXIBLE CIRCUIT BOARD

(75) Inventors: Yi-Jing Leu, Hsinchu (TW);
Chih-Ching Chen, Taipei (TW);
Ming-Chung Peng, Hsinchu (TW)

(73) Assignee: Benq Corporation, Taoyuan (TW)

( * ) Notice: Subject to any disclaimer, the term of this patent is extended or adjusted under 35 U.S.C. 154(b) by 159 days.

(21) Appl. No.: 10/400,457

(22) Filed: Mar. 28, 2003

(65) Prior Publication Data

US 2003/0159851 A1 Aug. 28, 2003

Related U.S. Application Data

(62) Division of application No. 10/128,354, filed on Apr. 24, 2002, now Pat. No. 6,735,865.

(30) Foreign Application Priority Data

Apr. 25, 2001 (TW) ......................................... 90109954 A (51) Int. Cl.$^7$ ............................. B41J 2/16; H05K 1/00; H05K 3/36; H05K 3/20; H05K 3/02
(52) U.S. Cl. .......................... 347/50; 361/750; 174/254; 29/830; 29/831; 29/840; 29/846; 29/884; 29/890.1
(58) Field of Search ........................... 347/50; 361/750; 174/254; 29/830, 831, 840, 846, 884, 880.1

(56) References Cited

U.S. PATENT DOCUMENTS 6,705,007 B1 * 3/2004 Kurita et al. ................. 29/852

FOREIGN PATENT DOCUMENTS

| CN | 1256613 A | 6/2000 | ............ H05K/3/06 |
|---|---|---|---|
| TW | 296536 | 1/1997 | |
| TW | 350785 | 1/1999 | |

OTHER PUBLICATIONS

Korsten, G.H., Photosensitive Soldering Masks. In: Circuit Board 86, vol. 1, Production of circuit boards today, VDI/VDE–Gesellschaft Feinwerktechnik, Dusseldorf, 1986, pp. 84–91.

Hummel, M., Introduction into the circuit board technology, Eugen Lenze Verlag, Saulgau/Wurtt., 1985, pp. 118–119.

Technical Information Du Pont, Pyralux PC 1000, 2000.

* cited by examiner

Primary Examiner—Stephen D. Meier
Assistant Examiner—Alfred Dudding
(74) Attorney, Agent, or Firm—Rabin & Berdo, P.C.

(57) ABSTRACT

A process of forming a flexible circuit board for ink jetting is provided. The process includes the steps of: providing an insulation tape; forming conductive traces on the insulation tape; and forming a photo-polymer layer filling between the conductive traces, wherein parts of the conductive traces are exposed to form a plurality of contacts. The material of the insulation tape can be polyimide, Teflon, polyamide, polymethylmethacrylate, polycarbonate, polyester, polyamide polyethylene-terephthalate copolymer, or any combination of the above materials. The material of the photo-polymer layer can be solder mask or polyimide.

9 Claims, 11 Drawing Sheets

FLEXIBLE CIRCUIT BOARD

The application is a Divisional Application of U.S. Ser. No. 10/128,354, filed Apr. 24, 2002 U.S. Pat. No. 6,735,865.

BACKGROUND OF THE INVENTION

1. Field of the Invention

The invention relates in general to a flexible circuit board, and more particularly to a flexible circuit board fabricated by using photo-polymer.

2. Description of the Related Art

Flexible circuit boards used in the cartridge of an ink-jet printer serve as medium to lead the driving current to the chip for ink jetting. The driving current drives the cartridge and enables the cartridge to jet ink.

Figure 1:
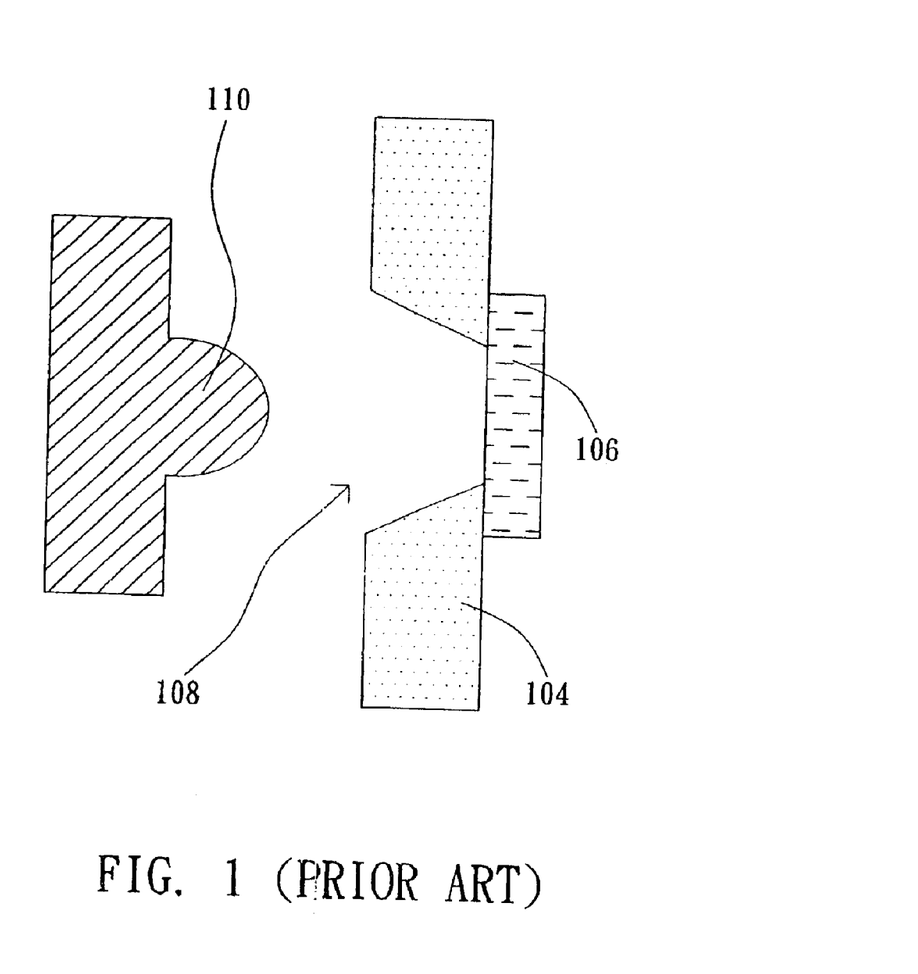
FIG. 1 (Prior Art) shows a conventional flexible circuit board and its relative position to the dimple of the printer.

FIG. 1 shows a conventional flexible circuit board and its relative position to the dimple of the printer. Polyimide (PI) is a commonly used substrate 104 for the conventional flexible circuit board. Copper (Cu) and gold (Au) are two widely used materials for the conductive traces 106 in the flexible circuit board. The dimples 110 of the printer circuit contact the conductive traces 106 through holes 108 formed by tape automated bonding (TAB).

Etching and punching are two typical TAB manufacturing processes. Etching process is characterized by etching the tape while the punching process is characterized by punching the tape to form the holes.

Figure 2A:
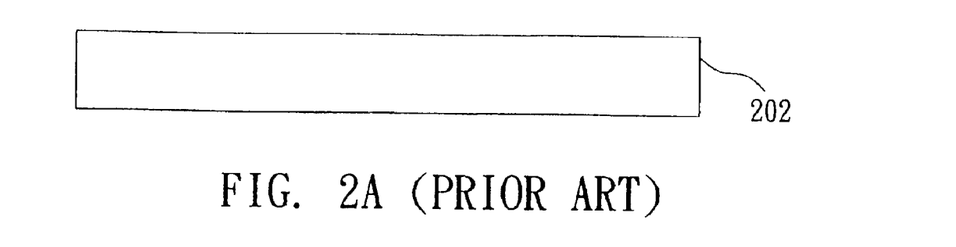
FIGS. 2A~2J (Prior Art) illustrate the conventional etching process.
Figure 2B:
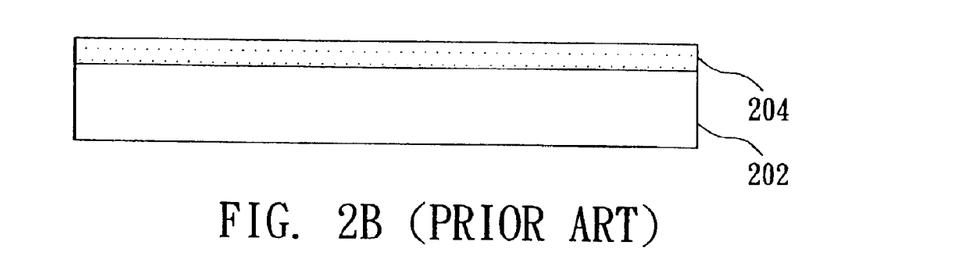
Figure 2C:
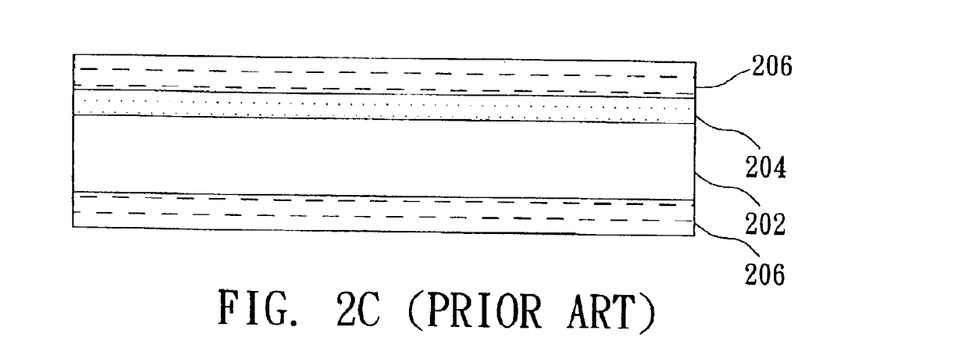
Figure 2D:
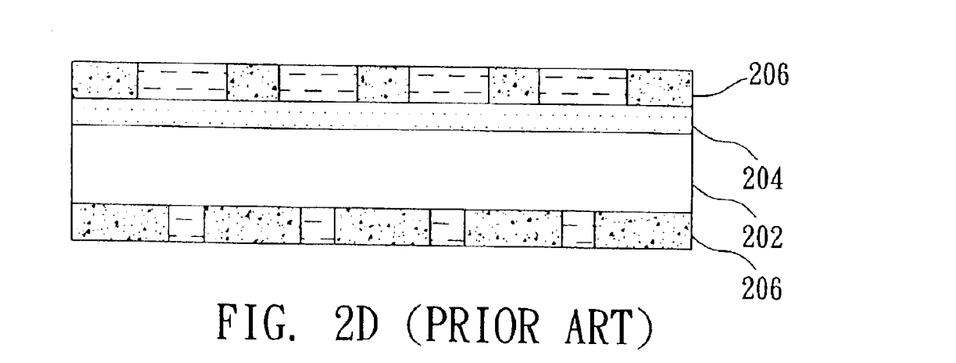
Figure 2E:
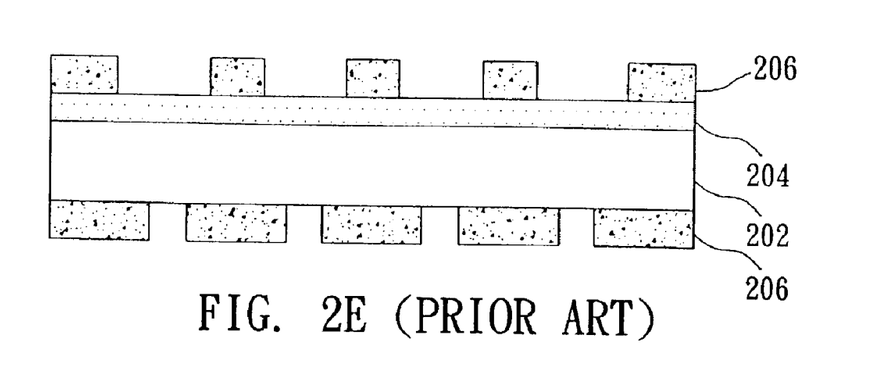
Figure 2F:
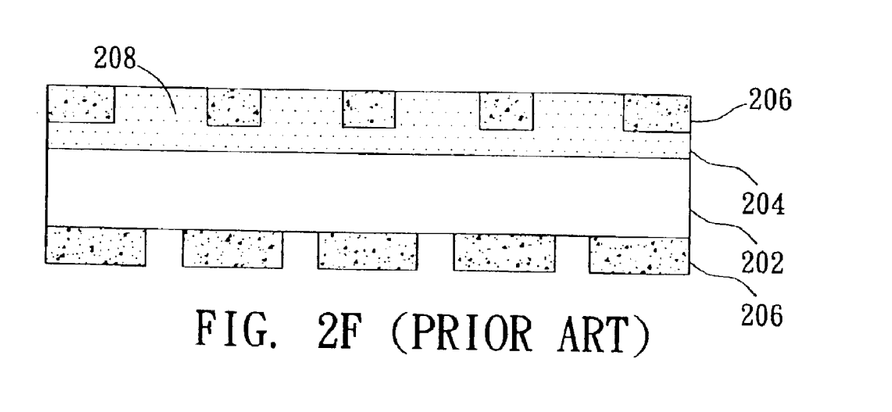
Figure 2G:
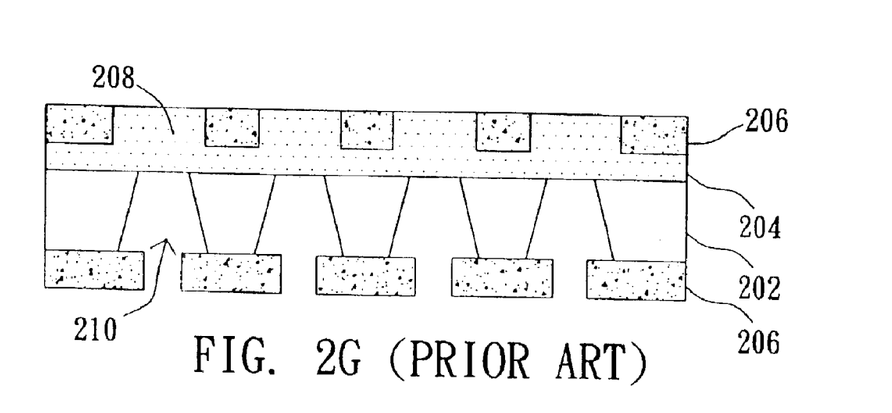
Figure 2H:
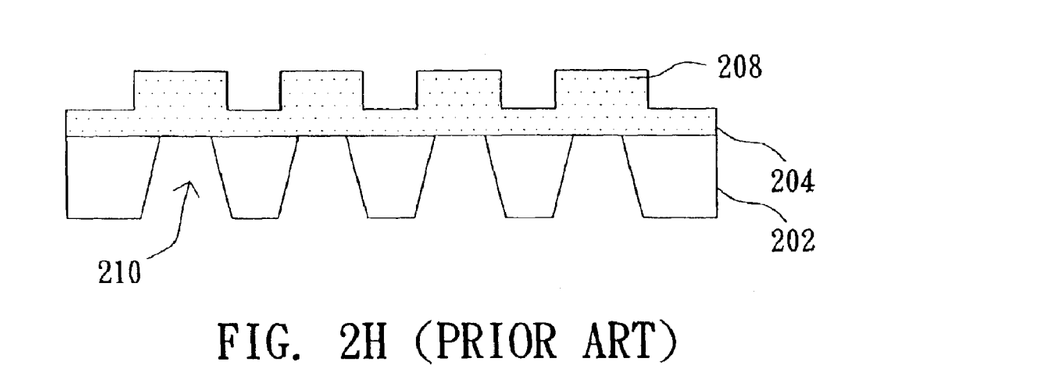
Figure 2I:
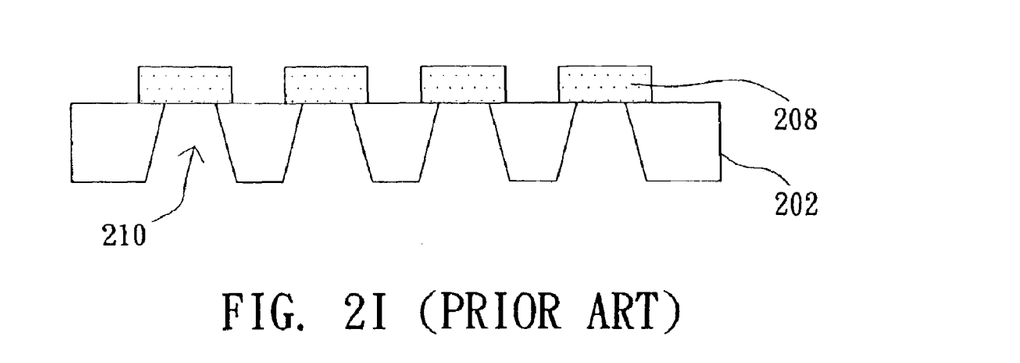
Figure 2J:
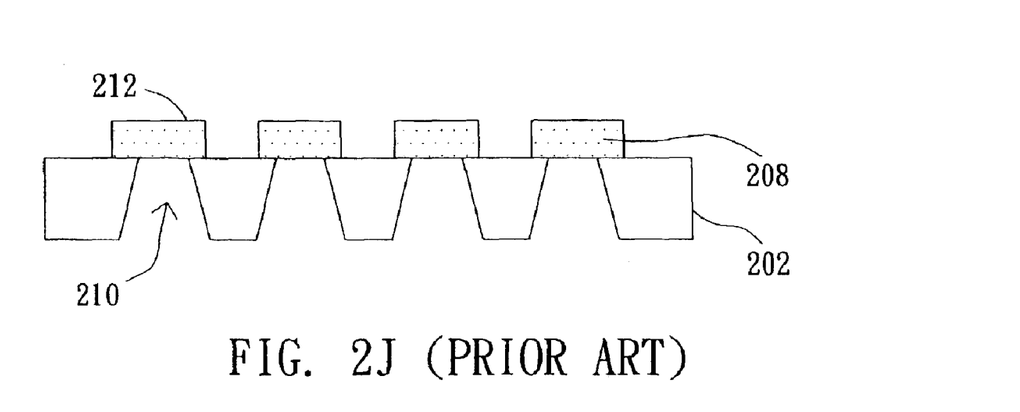

FIGS. 2A~2J illustrate the conventional etching process. On the substrate 202, such as polyimide (PI), a copper film 204 with a thickness of about 100 Å is formed by sputtering. On the bottom side of the substrate 202 and over the copper film 204, photo-resistors (PR) 206 are formed. After exposing and developing the PRs 206, the patterns of the holes and the conductive traces are defined. Next, as shown in FIG. 2F, on the side of substrate 202 with the exposed copper film 204, a copper layer 208 with several µm is plated. Then, as shown is FIG. 2G, the substrate 202 is etched to form holes 210 at the bottom side. The photo-resistors at both sides are then removed, as shown in FIG. 2H. Then, as shown in FIG. 2I, by a photolithography process, including steps of forming a photo-resister layer, exposing, developing and etching, the copper film 204 not covered by the copper layer 208 is removed. Finally, as shown in FIG. 2J, an insulation layer 212 is formed over the copper layer 208 for the purpose of protection.

The conventional etching process has the following drawbacks: time consuming, producing thick and sticky precipitate and large amount of wastewater, high cost and low yield rate.

FIGS. 3A to 3I show the conventional punching method to form holes on an insulation layer.

Figure 3A:
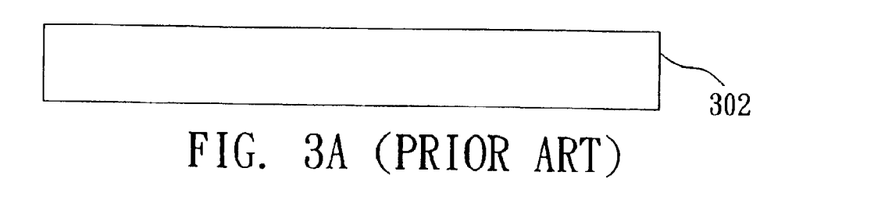
FIGS. 3A to 3I (Prior Art) show the conventional punching method to form holes on an insulation layer.
Figure 3B:
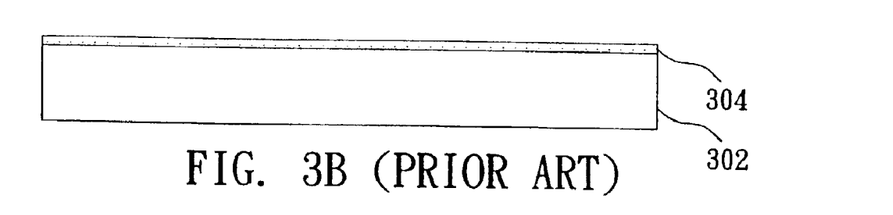
Figure 3C:
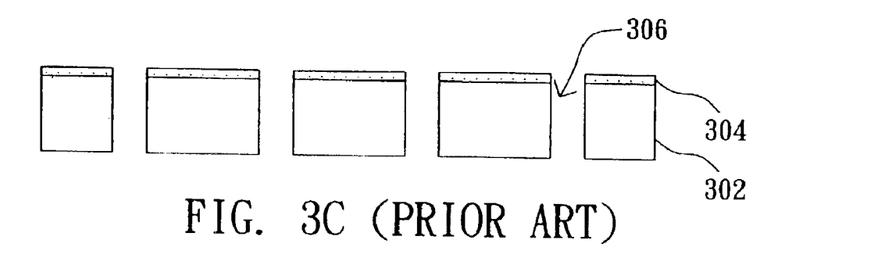
Figure 3D:
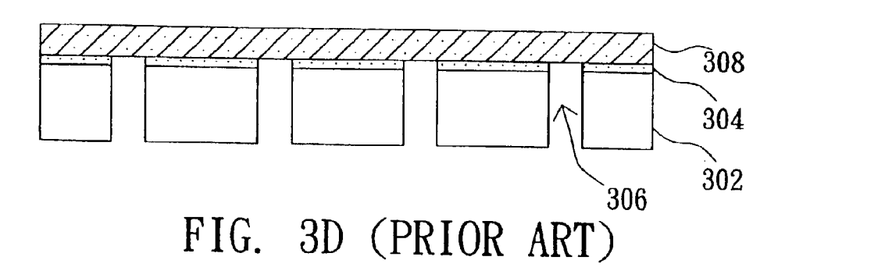
Figure 3E:
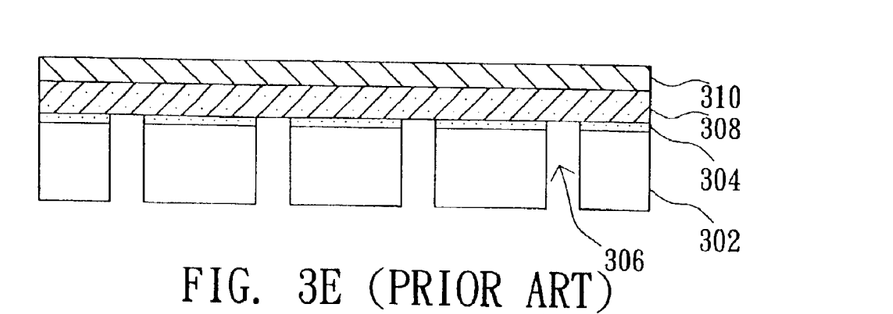
Figure 3F:
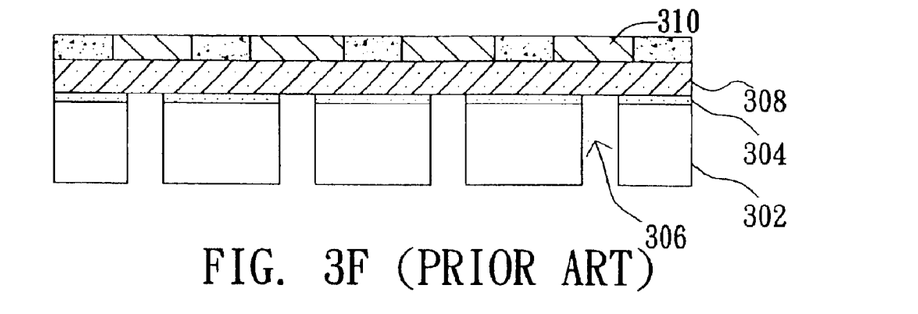
Figure 3G:
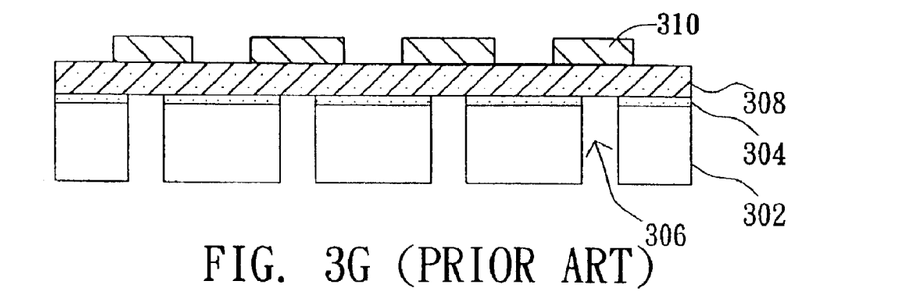
Figure 3H:
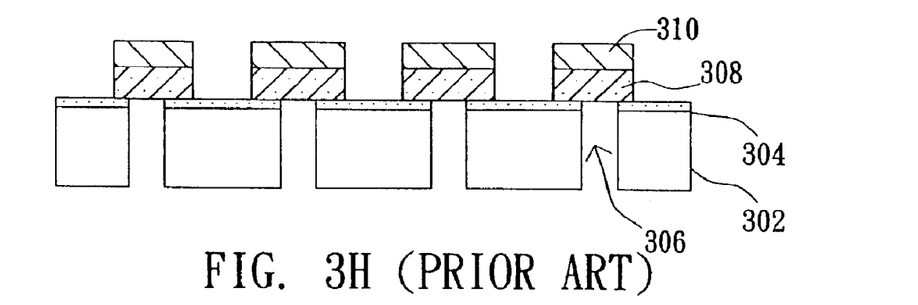
Figure 3I:
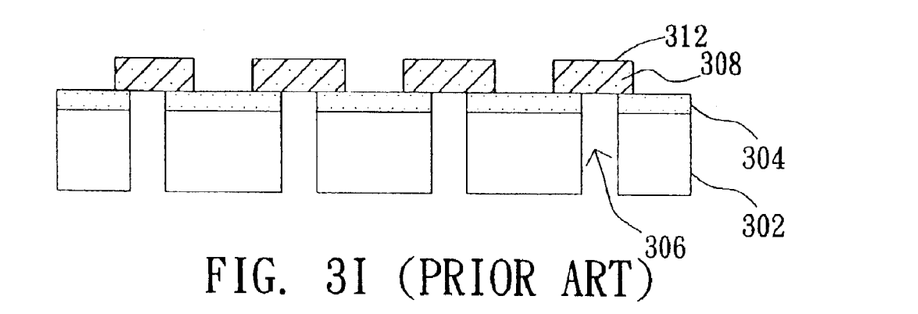

As shown in FIGS. 3A and 3B, an adhesive layer 304 is coated on the substrate 302. Then, the substrate 302 coated with the adhesive layer 304 is punched to form holes 306. Next, a copper layer 308 is adhered over the substrate 302 coated with the adhesive layer 304. Then, as shown in FIGS. 3E to 3H, a photo-resistor layer 310 is formed on the copper layer 308. After the photolithography process, including exposing, developing and etching, the pattern of the copper layer 308 is defined. Finally, as shown in FIG. 3I, an insulation adhesive layer 312 is formed on one side of the copper layer for the purpose of protection.

Compared with the etching process as mentioned before, this punching process is shorter in procedure, no problem of wastewater and lower cost. However, the intervals between each two holes are large and hard to reduce. So that, less holes can be formed in the same area, which therefore influences the precision contact between the printer and the TAB. Further more, the punching step could easily cause the breakage of the substrate and thus reduce the yield and increase the cost.

SUMMARY OF THE INVENTION

It is therefore an object of the invention to provide a flexible circuit board and a method of fabricating the same without having the problems of producing contaminating developer but with the advantages of shorter procedure, lower cost, high hole resolution, and high yield rate, which is suitable for mass production.

An improved and simplified process of forming a flexible circuit board for ink jetting comprises the steps of: providing an insulation tape; forming a conductive traces on the insulation tape; and forming a photo-polymer layer filling between the conductive traces, wherein parts of the conductive traces are exposed to form a plurality of contacts. The material of the insulation tape can be polyimide, Teflon, polyamide, polymethylmethacrylate, polycarbonate, polyester, polyamide polyethylene-terephthalate copolymer, or any combination of the above materials. The material of the photo-polymer layer can be solder mask or polyimide.

It is another object of the invention to provide a flexible circuit board for ink jetting, comprising: an insulation tape as a substrate; a plurality of conductive traces on the insulation tape; and a photo-polymer layer filling between the conductive traces, wherein parts of the conductive traces are exposed to form a plurality of contacts.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 4A:
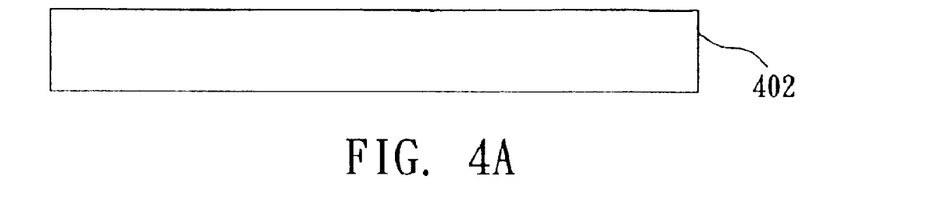
FIGS. 4A to 4J show a portion of the process of manufacturing the flexible circuit board according to a preferred embodiment of the invention.
Figure 4B:
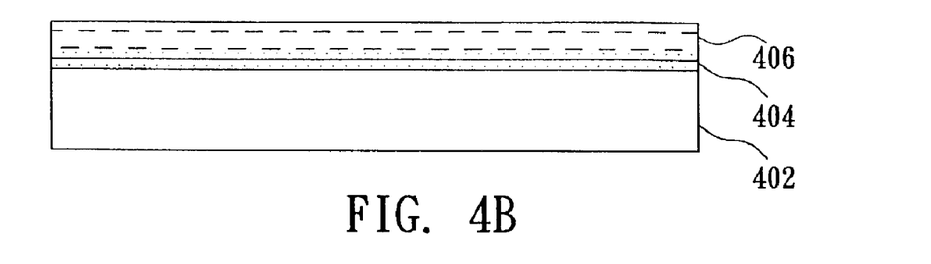
Figure 4C:
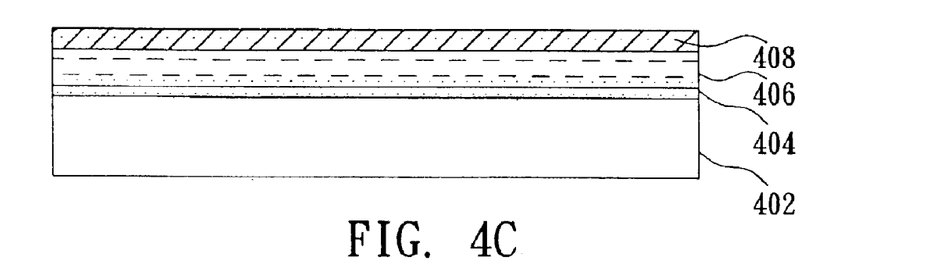
Figure 4D:
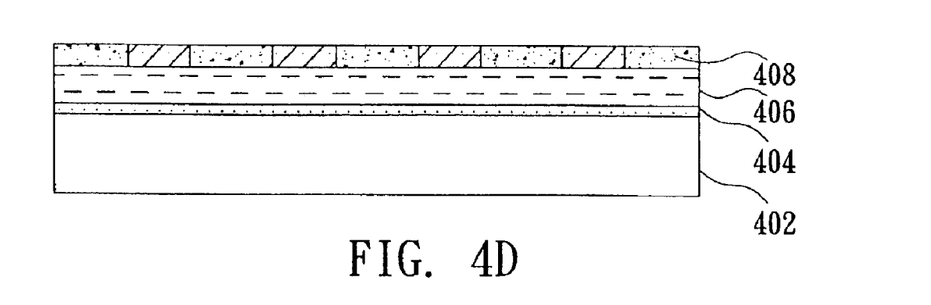
Figure 4E:
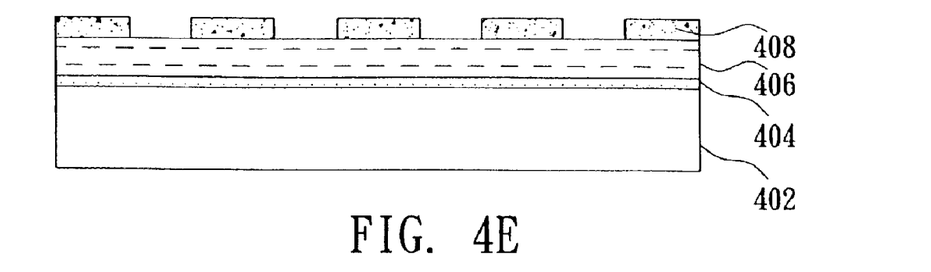
Figure 4F:
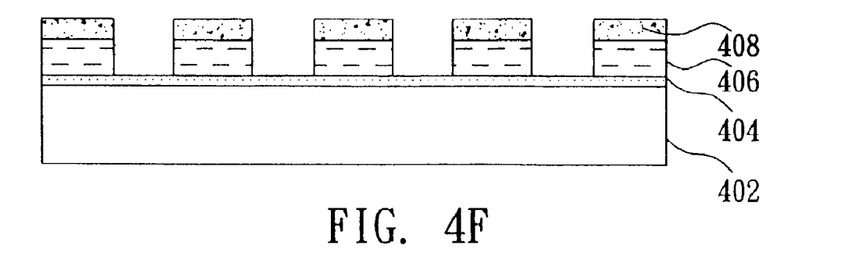
Figure 4G:
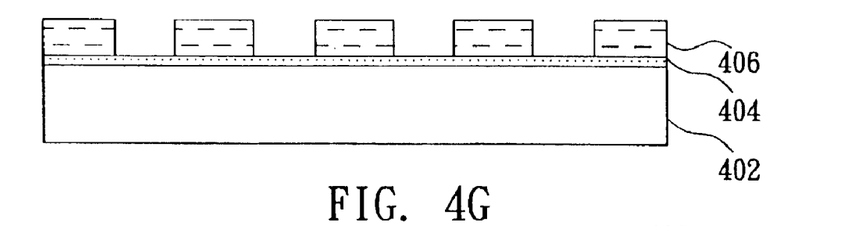

FIGS. 4A to 4J show a portion of the process of manufacturing the flexible circuit board according to a preferred embodiment of the invention. First, as shown in FIG. 4A and FIG. 4B, an adhesive layer 404 is coated over the insulation tape 402 made of the material such as polyimide (PI). And then, a conductive layer 406, the material of which is such as copper or gold, is formed over the adhesive layer 404 to form the conductive traces. The method of forming the conductive layer 406 can be adhering a copper foil or a gold foil on the insulation tape 402. The preferred thickness of the copper foil or the gold foil is about at the range of about 10 $\mu$m to 50 $\mu$m.

Next, as shown in FIG. 4C to FIG. 4G, a photo-resistor layer 408 is formed over the conductive layer 406. After defining the conductive layer 406 to a desired pattern, the photo-resistor layer 408 is removed. By now, the insulation tape 402 has conductive traces with a desired pattern on it.

Figure 4H:
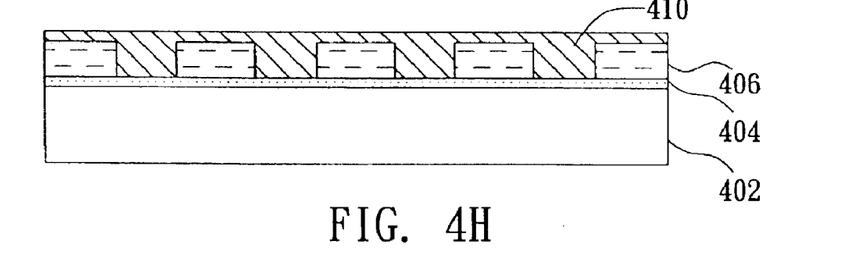

Next, as shown in FIG. 4H, a photo-polymer layer 410 is formed over the insulation tape 402 with conductive traces 406. Preferably, the photo-polymer layer 410 can be formed by screen printing, spray coating, curtain coating or roller coating. The preferred material of the photo-polymer layer 410 can be solder mask. Solder mask could form cross-linking while it is exposed to the light. Solder mask with cross-linking, like a negative photo-resistor, is strong in structure and is insoluble in developer. Moreover, material like polyimide (PI) can also produce the same result.

Figure 4I:
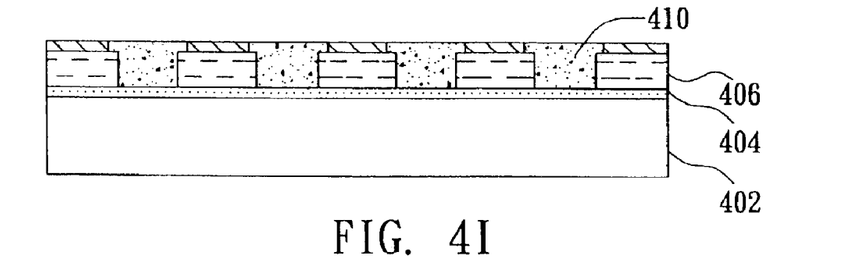
Figure 4J:
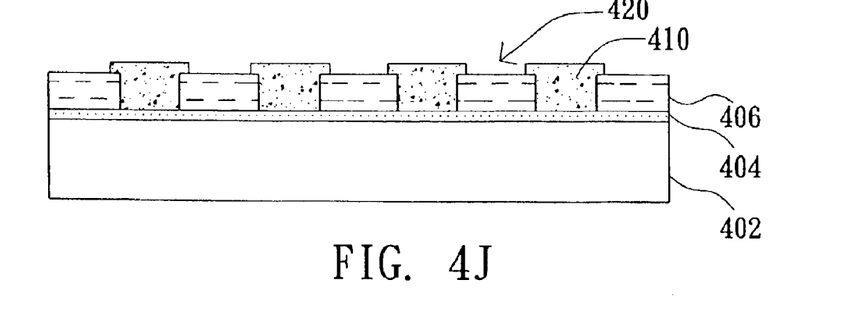

As shown in FIG. 4I and FIG. 4J, a portion of the photo-polymer layer 410 is removed to expose parts of the conductive traces 406 by developing. After a post-curing process, the photo-polymer 410 is hardened.

Figure 5:
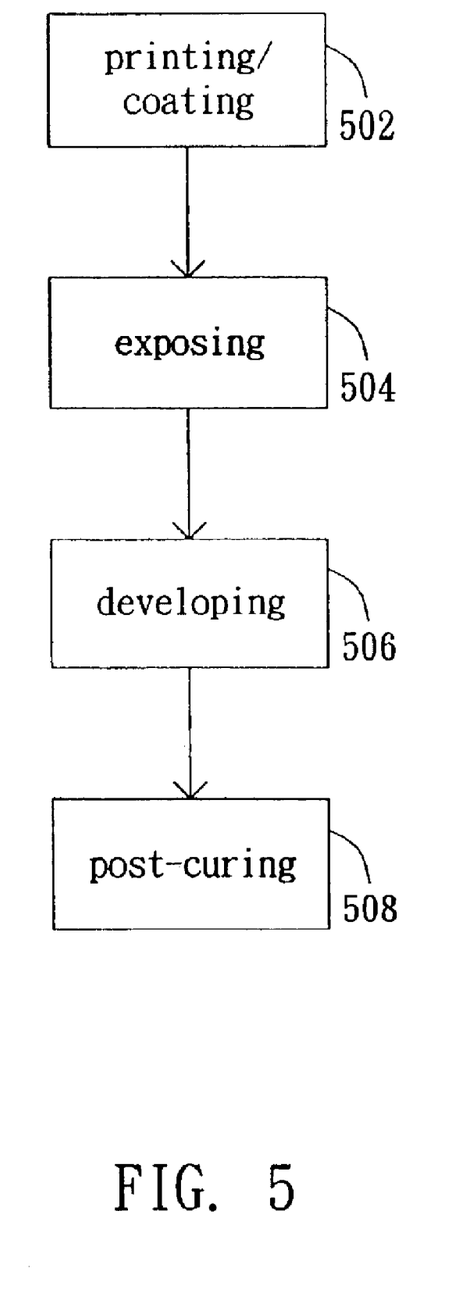
FIG. 5 shows the process of forming, exposing, developing and post-curing the photo-polymer layer.

FIG. 5 shows the process of forming, exposing, developing and post-curing the photo-polymer layer 410. A preferred material of the photo-polymer 410 of the invention is the PSR9000 series A01 type photo-solder mask. The preferred ratio of the main agent and the hardener is about 7:3. After the photo-polymer layer 410 is coated (step 502), an exposing step 504 is performed. The ideal exposure energy is about 280~420 mJ/cm$^2$. Then during the developing process 506, at the temperature lower than 30° C., 1 wt % Na$_2$CO$_3$ solution is used to develop the photo-polymer 410 for about 60~90 sec. At the step of post-curing 508, the flexible circuit board is placed at a hot air convention oven at 150° C. for about 50 min.

Besides polyimide (PI), the material of the insulation tape can be other polymer film such as Teflon, polyamide, polymethylmethacrylate, polycarbonate, polyester, polyamide polyethylene-terephthalate copolymer, or any combination of the above materials.

Thus, the flexible circuit board fabricated according to a preferred embodiment of the invention has a structure as describe below. On one side of the insulation tape 402, there are the conductive traces 406, and on the same side the photo-polymer 410 fills between the conductive traces 406 and not completely covering the conductive traces 406. The photo-polymer 410 thus forms the holes 420 exposing parts of the conductive traces 406 to form a plurality of contacts.

Figure 6:
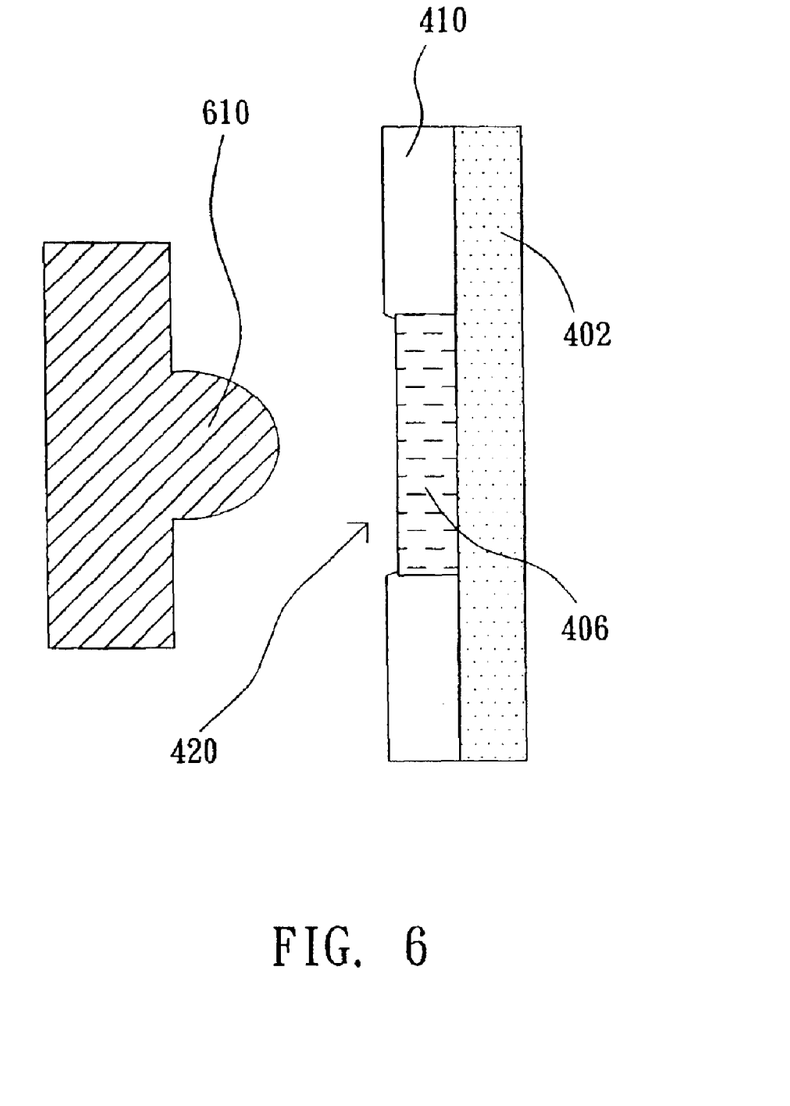
FIG. 6 shows the flexible circuit board of the invention and its relative position to the dimple 610 in the printer.

Referring to FIG. 1, it is apparent that conventionally, the dimple 110 of the printer (not shown) contacts with the conductive layer 106 of the flexible circuit board at the other side of the insulation tape 104 through the hole 108. Comparatively, the conductive layer 406 of the flexible circuit board of the invention is positioned at the side of the insulation tape 402 near the dimple of the printer. Therefore, by using the flexible circuit board of the invention, the dimple of the printer is able to contact the conductive layer more directly and precisely.

Figure 7:
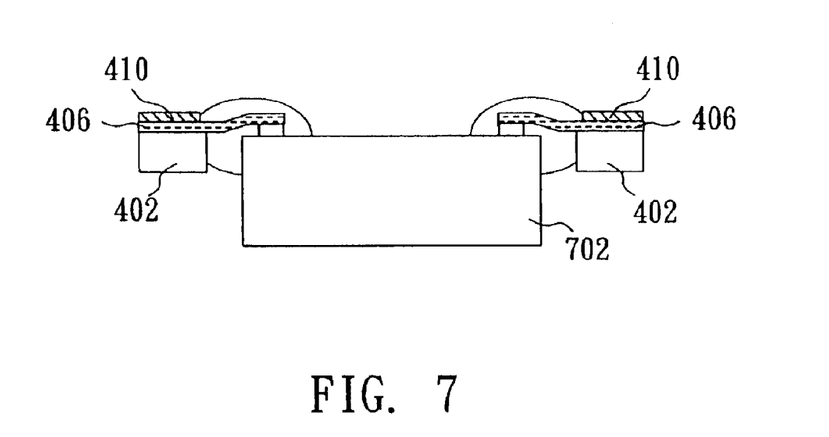
FIG. 7 shows the flexible circuit board of the invention and the chip.

Referring then to FIG. 7, the conductive layer 406 hardly bends while the flexible circuit board of the invention adheres to the chip 702 because the insulation tape 402 and the chip 702 are at the same side of the conductive layer 406.

Figure 8:
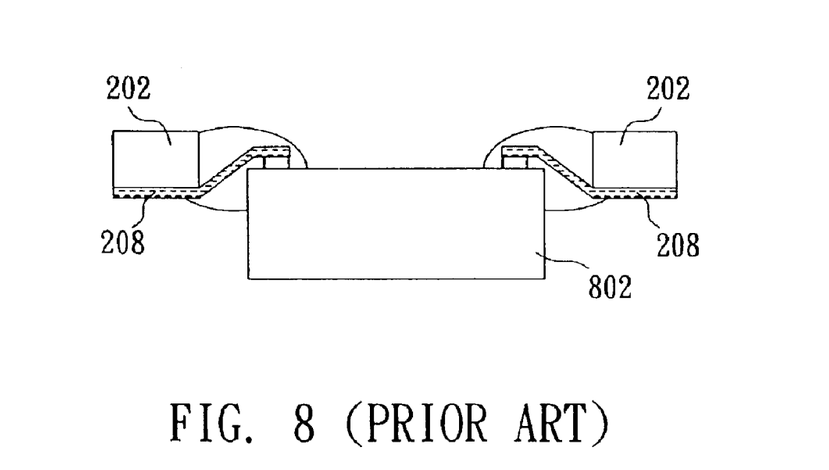
FIG. 8 (Prior Art) shows the conventional flexible circuit board and the chip.

On the contrary, referring to FIG. 8, the conductive layer 208 bends greatly while the flexible circuit board adheres to the chip 802 because the insulation tape 202 and the chip 802 are at the opposite sides of the conductive layer 208. With the character of less bending of the conductive layer 406, the flexible circuit board of the invention has the advantage of less opportunity of short circuit.

Forming contacts on the insulation tape according to the preferred embodiment of the invention has the following advantages:

(1) Photo-polymer applied in the invention provides higher conductive traces density and better coverage than the conventional dry film;

(2) Solution with weak alkalinity is used in developer, which is low in cost in terms of reagent and equipments and causes no pollution;

(3) The conductive layer hardly bends so that the problem of short circuit is eliminated.

Moreover, the process of the invention does not need the step of punching holes on the insulation tape and thus includes the following advantages: shortened manufacturing process, lower cost, high hole resolution, and high yield rate (up to 99%), which is suitable for mass production.

While the invention has been described by way of an example of manufacturing a flexible circuit board (FCB), it is to be understood TAB device is also within the scope of the invention since FCB is commonly bounded with the chip through a TAB process.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A flexible circuit board for ink jetting, comprising:
   an insulation tape as a substrate;
   conductive traces on the insulation tape; and
   a photo-polymer layer filling between the conductive traces, wherein parts of the conductive traces are exposed to form a plurality of contacts.

2. The flexible circuit board according to claim 1, wherein the insulation tape comprises a polymer film.

3. The flexible circuit board according to claim 2, wherein the material of the polymer film comprising at least one of polyimide (PI), Teflon, polyamide, polymethyl methacrylate, polycarbonate, polyester, and polyamide polyethylene-terephthalate copolymer.

4. The flexible circuit board according to claim 1, wherein the material of the photo-polymer layer is solder mask.

5. The flexible circuit board according to claim 1, wherein the photo-polymer layer is made of solder mask and the solder mask comprises a main agent and a hardener with a ratio of about 7:3.

6. The flexible circuit board according to claim 1, wherein a material of the photo-polymer layer is polyimide.

7. The flexible circuit board according to claim 1, wherein a material of the conductive traces is copper.

8. The flexible circuit board according to claim 1, wherein a material of the conductive traces is gold.

9. The flexible circuit board according to claim 1, wherein a thickness of the conductive traces is about 10 $\mu$m to 50 $\mu$m.

* * * * *